United States Patent [19]

Mizutani et al.

[11] Patent Number: 5,061,978
[45] Date of Patent: Oct. 29, 1991

[54] SEMICONDUCTOR PHOTOSENSING DEVICE WITH LIGHT SHIELD

[75] Inventors: Hidemasa Mizutani, Sagamihara; Shigeki Kondo, Hiratsuka, both of Japan

[73] Assignee: Canon Kabushiki Kaisha, Tokyo, Japan

[21] Appl. No.: 496,092

[22] Filed: Mar. 15, 1990

Related U.S. Application Data

[63] Continuation of Ser. No. 206,995, Jun. 14, 1988, abandoned, which is a continuation of Ser. No. 12,368, Feb. 9, 1987, abandoned.

[30] Foreign Application Priority Data

Feb. 28, 1986 [JP] Japan .................. 61-44789
Mar. 28, 1986 [JP] Japan .................. 61-68398

[51] Int. Cl.$^5$ .......................................... H01L 27/14
[52] U.S. Cl. .................................. 357/30; 357/58; 357/32; 357/53
[58] Field of Search ............... 357/58, 30 L, 30 H, 357/30 P, 30 D, 30 G, 32, 53

[56] References Cited

U.S. PATENT DOCUMENTS

| | | | |
|---|---|---|---|
| 4,291,326 | 9/1981 | Higuchi et al. | 357/30 L X |
| 4,419,533 | 12/1983 | Czubatyj et al. | 357/30 L X |
| 4,621,275 | 11/1986 | Ueno et al. | 357/30 L |
| 4,654,536 | 3/1987 | Saito et al. | 357/30 L X |
| 4,672,221 | 6/1987 | Saito et al. | 357/30 L X |

FOREIGN PATENT DOCUMENTS 61-61457 3/1986 Japan .
61-161757 7/1986 Japan ................ 357/30 L

*Primary Examiner*—William Mintel
*Attorney, Agent, or Firm*—Fitzpatrick, Cella, Harper & Scinto

[57] ABSTRACT

A semiconductor device having a circuit portion formed on a substrate, a light shielding layer for shielding the circuit portion from light, stacked on the substrate with an insulation layer being interleaved therebetween, and means for shielding the circuit portion from obliquely impinging light.

30 Claims, 5 Drawing Sheets

(A)

(B)

(A)

(B)

(A)

(B)

SEMICONDUCTOR PHOTOSENSING DEVICE WITH LIGHT SHIELD

This application is a continuation of application Ser. No. 07/206,995, filed June 14, 1988, which is a continuation of Ser. No. 07/012,368, filed Feb. 9, 1987, both now abandoned.

BACKGROUND OF THE INVENTION

1. Field of the Invention

The present invention relates to a semiconductor device including a circuit portion which requires light shielding, and more particularly to a semiconductor device which prevents light from entering a circuit portion to stabilize a circuit operation.

2. Related Background Art

Let us consider a photo-sensor device having a photo-sensor and a peripheral circuit such as an amplifier formed on one substrate.

FIG. 1 shows a sectional view of a related photo-sensor 1 which is basically disclosed in Japanese Patent Application Laid-Open No. 61457/1986.

A photo-sensor PD, an MOS transistor MOS and a bipolar transistor BI are formed in a P semiconductor substrate 1 with P+ regions formed therebetween.

In the photo-sensor PD, a P+ region 3 is formed in an N− region 2 to form a P+−N− photo-diode. In the MOS transistor MOS, P+ regions 5 are formed in an N− region 4 as source and drain regions, and in the bipolar transistor BI, a P+ region 7 as a base region is formed in an N− region 6.

A gate oxidization film having a thickness of 500 Å A is formed on the substrate 1 and regions in which N+ regions are to be formed are etched away. Phosphorus doped polysilcon is deposited and patterned to form an electrode 8 of the photo-diode, a gate electrode 9 of the MOS transistor and an emitter electrode 10 and a collector electrode 11 of the bipolar transistor. Then, an oxide film 12 having a thickness of 1500–2000 Å is formed by thermal oxidization, and the impurity phosphorus in the polysilicon is diffused into the substrate 1 to form an N+ region 13, an emitter region 14 and an N+ region 15.

A PSG film 16 having a thickness of 6000 Å is formed on the oxidization film 12 by a CVD method, contact holes are formed in the oxidization film 12 and the PSG film 16, and Al wirings 17 are formed on the elements. Then, a plasma nitride film 18 is formed, an Al light shielding layer 19 is formed, and a passivation plasma nitride film 20 is formed. Then, the plasma nitride films 20 and 18 and the light shielding layer 19 on the photo-diode PD are removed by plasma etching to form a photo-sensing area 21.

In this arrangement, external light merely impinges on the photo-diode PD through the photo-sensing area 21 and the external light is blocked in other areas by the light shielding layer 19.

Under a strong external light, block resin is coated except on the photo-sensing area 21 to form double-molding.

With such a semiconductor device, if strong light impinges on the device obliquely, light may impinge on a portion of the device which should be shielded from the light, with the result that an output characteristic of the device is influenced.

FIG. 2 shows a sectional view of an end of a prior art device. When light 22 impinges on the device obliquely, it is multi-reflected between an interface of the substrate 1 and an interface of the light shielding layer 19 and finally reaches another component in the device, which may, for example, be a transistor. Usually, light intensity rapidly attenuates by as a result of several reflections but if the light intensity is high, the light may still reach the other component after the multi-reflection, and the output characteristic of the device is affected. Such multi-reflection also occurs between interfaces formed when insulation layers of different refraction coefficients are stacked.

The output characteristic is also affected when the light obliquely impinges from the photo-sensing area 21.

SUMMARY OF THE INVENTION

It is an object of the present invention to provide a semiconductor device having means for shielding a circuit portion from an obliquely impinging light.

It is another object of the present invention to shield the obliquely impinging light by providing scatter means in an insulation layer in a vicinity of the circuit-portion.

It is another object of the present invention to shield the obliquely impinging light by substantially covering an end of the insulation layer by the light shielding layer.

DETAILED DESCRIPTION OF THE PREFERRED EMBODIMENTS

Figure 1:
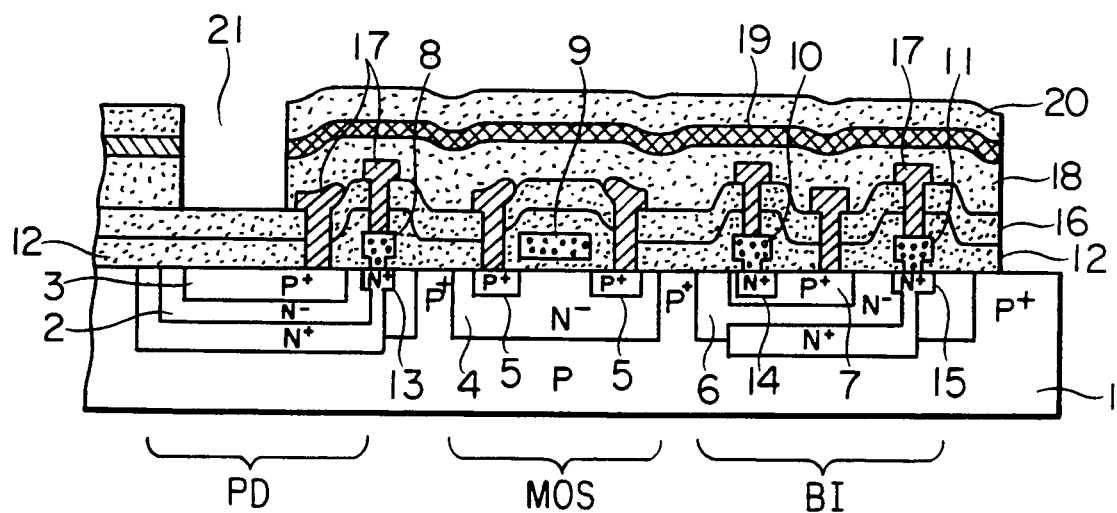
FIG. 1 shows a sectional view of a prior art photo-sensor device (shown in Japanese Patent Application No. 183149/1984) laid-open as No. 61457/1986.
Figure 2:
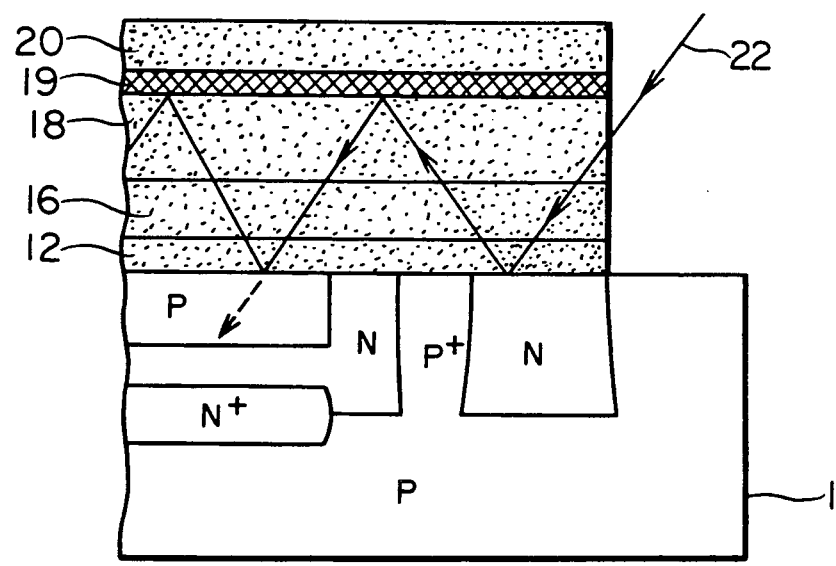
FIG. 2 shows a sectional view of an end of the prior art device.
Figure 3:
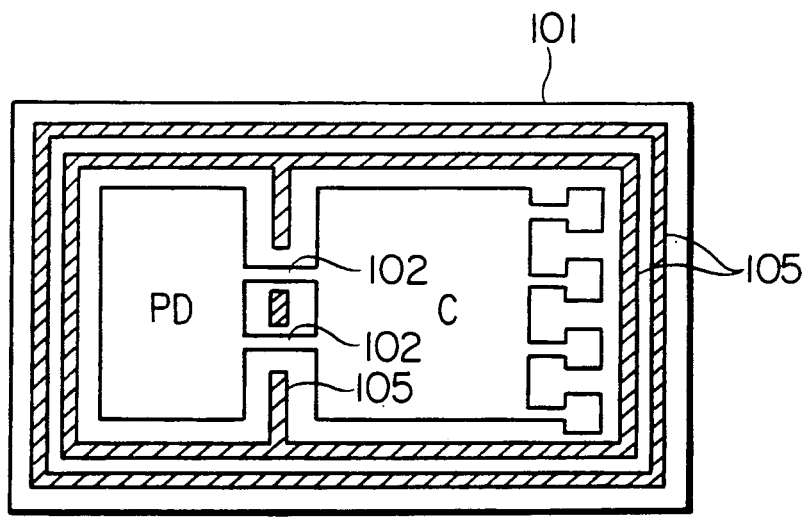
FIG. 3(A) shows a plan view of a first embodiment of a photo-sensor device of the present invention.
FIG. 3(B) shows a sectional view of a periphery thereof.
Figure 3:
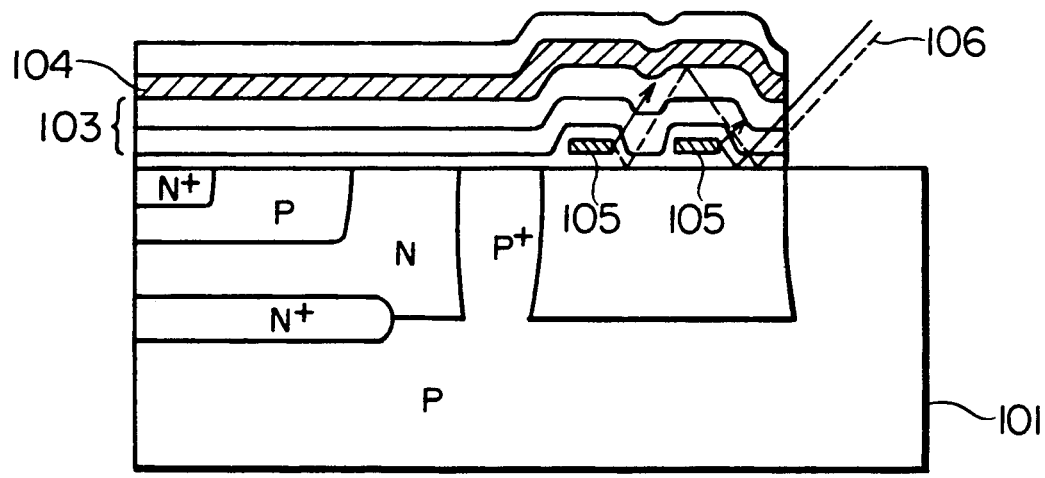

FIG. 3(A) shows a plan view of a photo-sensor device in accordance with a first embodiment of a semiconductor device of the present invention, and FIG. 3(B) shows a sectional view of a periphery thereof.

A circuit portion C including a photo-diode PD, MOS transistors and bipolar transistors is formed on a semiconductor substrate 101, and an output of the photo-diode is supplied to the circuit portion C through an Al wiring 102. An insulation layer 103 and a light shielding layer 104 are stacked on the substrate 101. The insulation layer 103 corresponds to the insulation layers 12, 16 and 18 in the prior art device. Two scattering lines of polysilicon layers 105 as scatter means are arranged on a periphery of the substrate 101 in the insulation layer 103, and one line of polysilicon layer 105 is formed between a photo-diode area PD and the circuit portion C.

The polysilicon layer 105 may be formed simultaneously with polysilicon electrode in the photo-diode PD and the circuit poriton C (which correspond to the electrode 8, gate electrode 9 and electrode 10 and 11 in the prior art device).

Because of the provision of the polysilicon layer 105, the obliquely impinged light 106 is scattered by the polysilicon layer 105 and attenuated thereby so that multi-reflection propagation does not occur. Accordingly, the light does not reach the circuit portion C and the output characteristic of the circuit portion C is not effected.

The polysilicon layer 105 may be in one line, but a greater effect is attained if it is in plural lines at a random pitch.

The scatter means need not be made of polysilicon but it may be made of Al used as the wiring material in the circuit portion C. Any material may be used so long as the scatter means is simultaneously formed with the electrodes and wirings of the circuit portion C without increasing the number of steps to form the scatter means.

Figure 4:
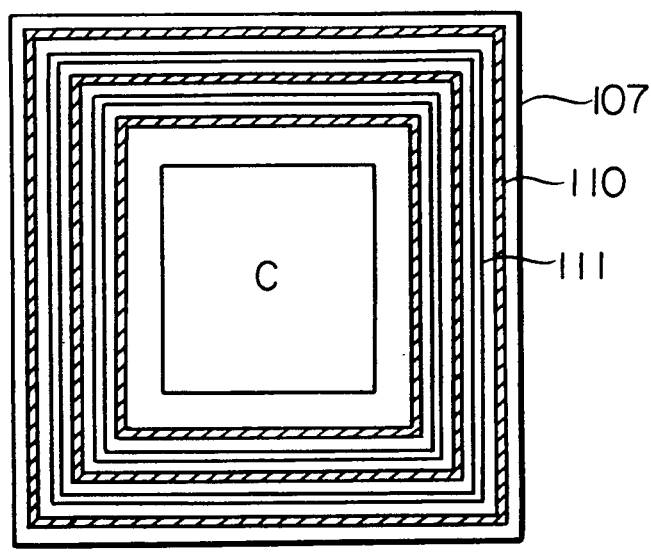
FIG. 4(A) shows a plan view of a second embodiment of the present invention.
FIG. 4(B) shows a sectional view of a periphery thereof
Figure 4:
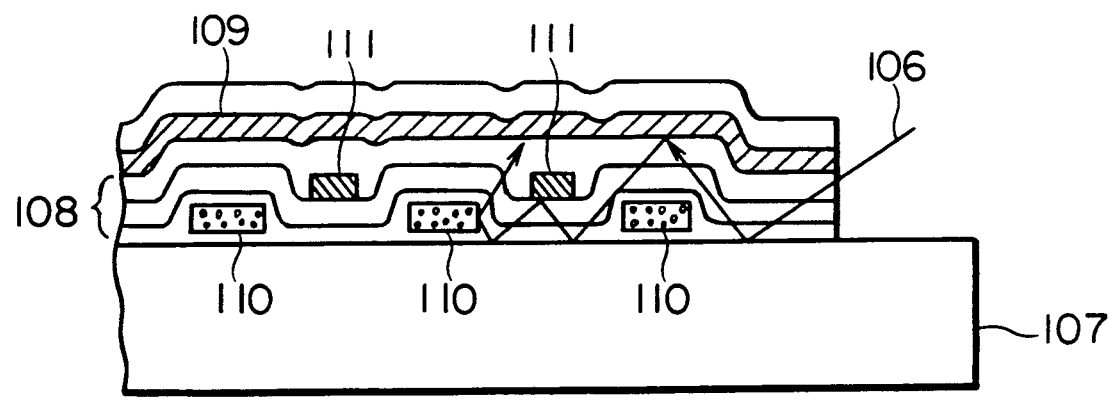

FIG. 4(A) shows a plan view of a second embodiment of the present invention, and FIG. 4(B) shows a sectional view of a periphery thereof.

In FIGS. 4(A) and 4(B), a circuit portion C is formed on a semiconductor substrate 107, and an insulation layer 108 and a light shielding layer 109 are formed thereon. Polysilicon layers 110 and Al layers 111 are alternately arranged around the circuit portion C. The polysilicon layer 110 is formed simultaneously with a gate electrode of a MOS transistor of the circuit portion C, and the Al layers 111 are formed simultaneously with the Al wiring.

In the present embodiment, since the polysilicon layers 110 and the Al layers 111, as the scatter means, are located at different positions in the direction normal to the substrate, the multi-reflection is more efficiently prevented. The light attenuation by the diffused reflection on the surfaces of the polysilicon layers 110 and the Al layers 111 also promotes the effect of prevention of the multi-reflection.

In the present embodiment, since the scatter means is provided around the circuit portion, the obliquely impinged light is not reflected as a collimated light and the light is abruptly attenuated in the insulation layer around the circuit portion. Accordingly, even if a strong light obliquely impinges, the effect of the external light to the circuit portion is perfectly prevented. As a result, the operation of the semiconductor device is not affected by the external light and is stable.

Figure 5:
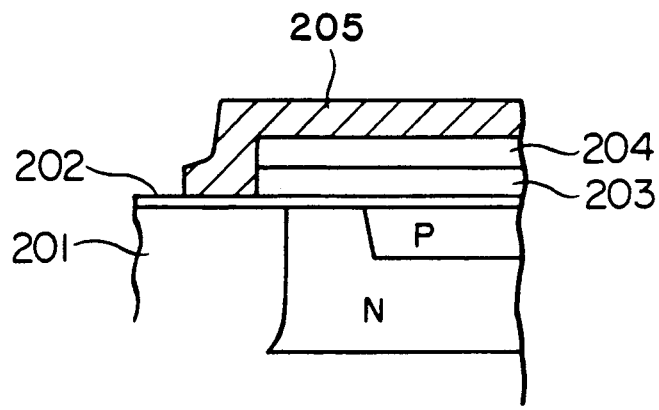
FIG. 5 shows a partial sectional view of a third embodiment of the semiconductor device of the present invention.

FIG. 5 shows a partial sectional view of a third embodiment of the semiconductor device of the present invention.

A circuit portion comprising transistors is formed on a P-type semiconductor substrate 201, and a thin insulation layer 202 having a thickness of approximately 1500 Å and serving as a gate insulation film of a MOS transistor is formed on the substrate 201. Thick insulation layers 203 and 204 are formed thereon, and an Al light shielding layer 205 for shielding the circuit portion from light is formed on the insulation layer 204 and ends of the insulation layers 203 and 204.

A total thickness of the insulation layers 203 and 204 is 14,000–18,000 Å which is sufficiently thicker than the insulation layer 202. Accordingly, the effect of the obliquely impinged light can be prevented by covering the ends of the insulation layers 203 and 204 by the light shielding layer 205.

In the present embodiment, the light shielding layer 205 is made of conductive material such as Al but it electrically floats since it is insulated from the substrate 201 by the insulation layer 202. The light shielding layer 205 may be connected to the substrate 201 through a contact hole to fix it to ground level.

Figure 6:
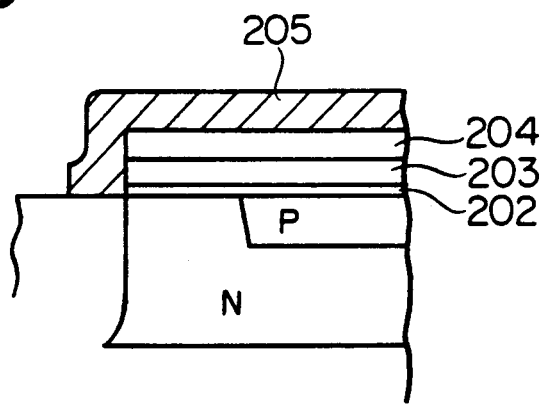
FIG. 6 shows a partial sectional view of a fourth embodiment of the present invention.

FIG. 6 shows a partial sectional view of a fourth embodiment.

In the present embodiment, a circuit portion faces a scribe line of a wafer, and an end of insulation layers 202, 203 and 204 are completely covered by a light shielding layer 205. Accordingly, an obliquely impinged light is more perfectly blocked.

Figure 7:
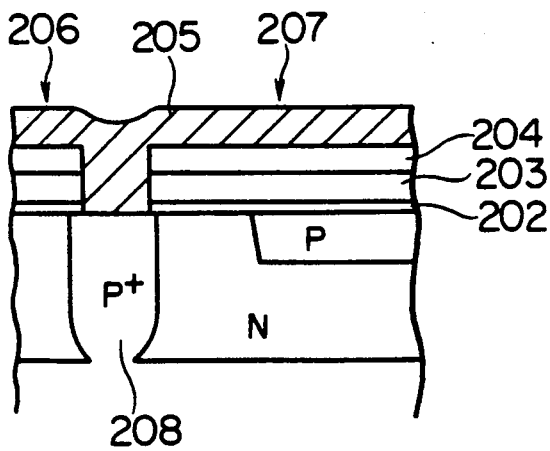
FIG. 7 shows a partial second view of a fifth embodiment of the present invention.

FIG. 7 shows a partial sectional view of a fifth embodiment of the present invention.

In the present embodiment, a photo-diode 206 having a photo-sensing area and a circuit portion 207 are electrically isolated by a device isolation region 208. A light obliquely impinged from a sidewall of the photo-sensing area may possibly reach the circuit portion 207 by the multi-reflection.

In order to prevent such a multi-reflection, the ends of the insulation layers 202, 203 and 204 on the circuit portion 207 are formed on the P+ device isolation region 208 and the ends are covered by the light shielding layer 205 to prevent the light from entering into the circuit portion 207.

Since the light-shielding layer 205 is connected to the high impurity concentration P+ device isolation region 208, it is always maintained at a fixed potential, and a parasitic capacitance between the light shielding layer 205 and the substrate 201 is reduced and stabilized. Thus, the circuit characteristic is improved.

Figure 8A:
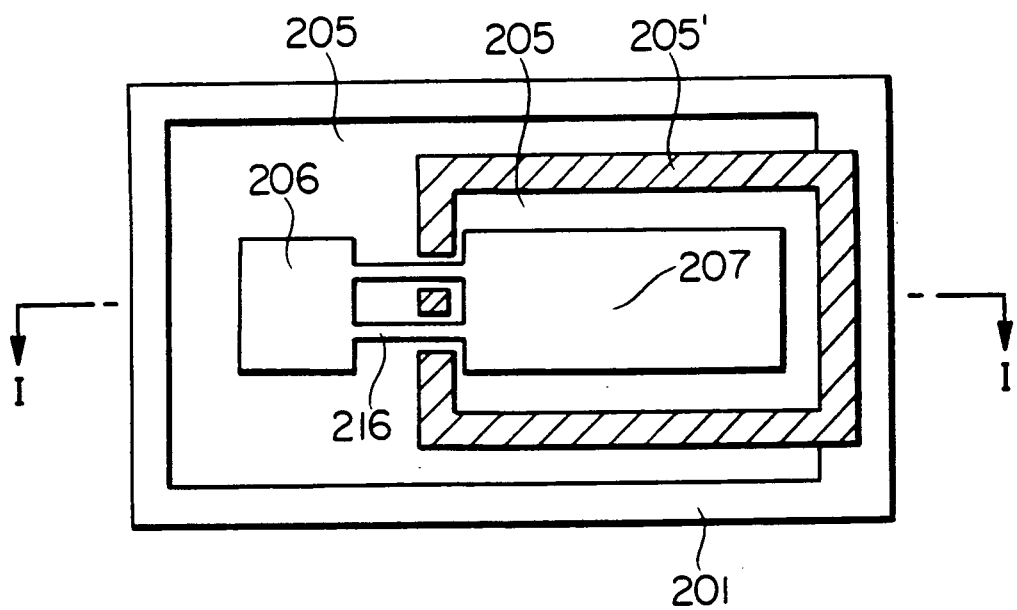
FIG. 8(A) shows a plan view of a photo-sensor device in accordance with the present invention.
Figure 8B:
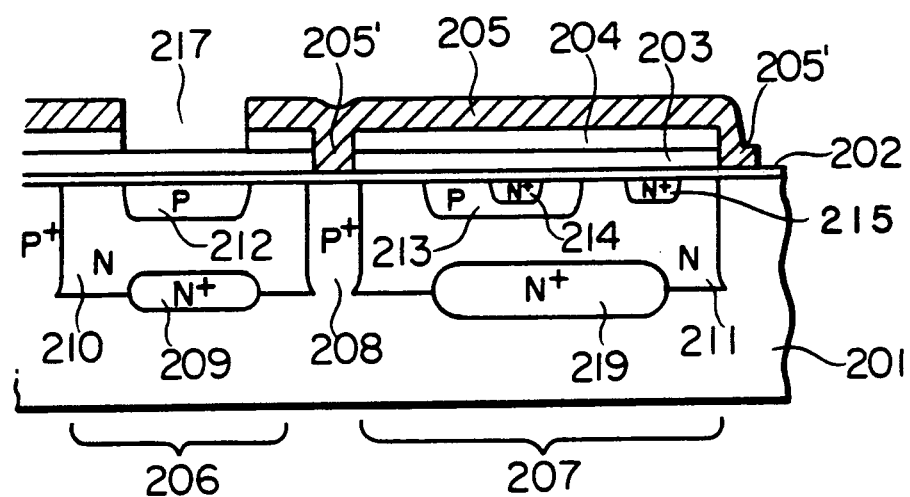
FIG. 8(B) shows a sectional view, taken along a line I—I of the photo-sensor device of FIG. 8(A).
Figure 5:
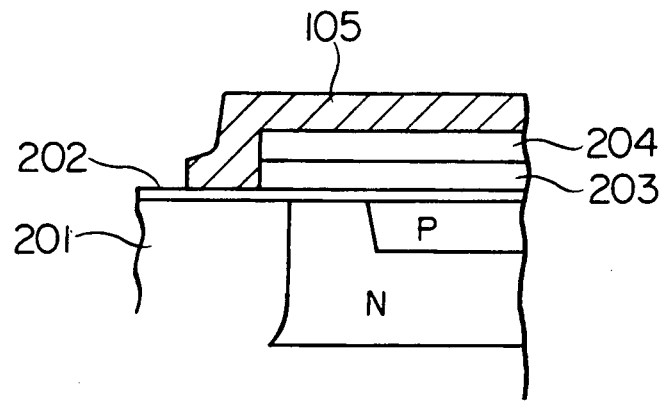
Figure 6:
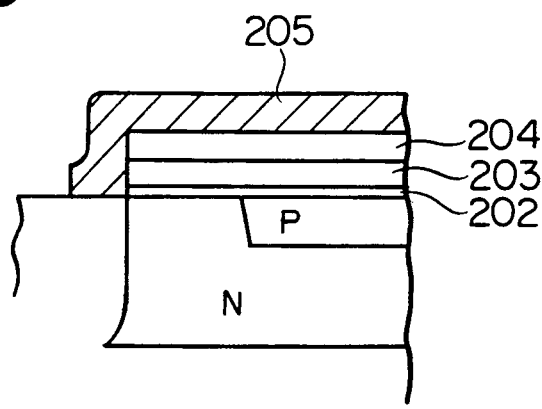
Figure 7:
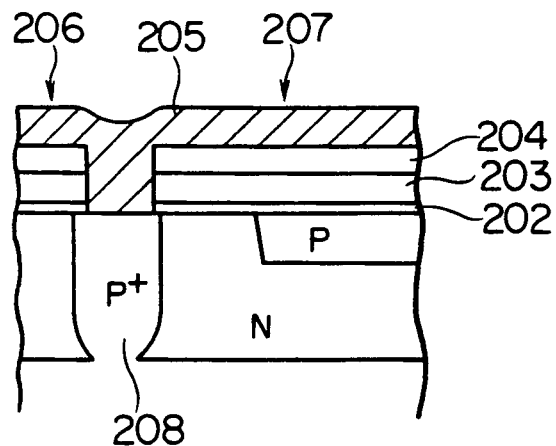
Figure 8:
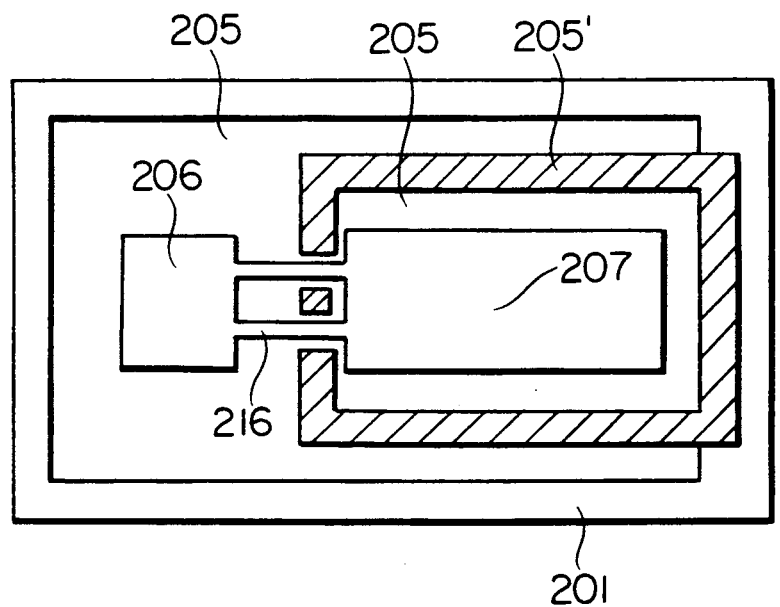
Figure 8:
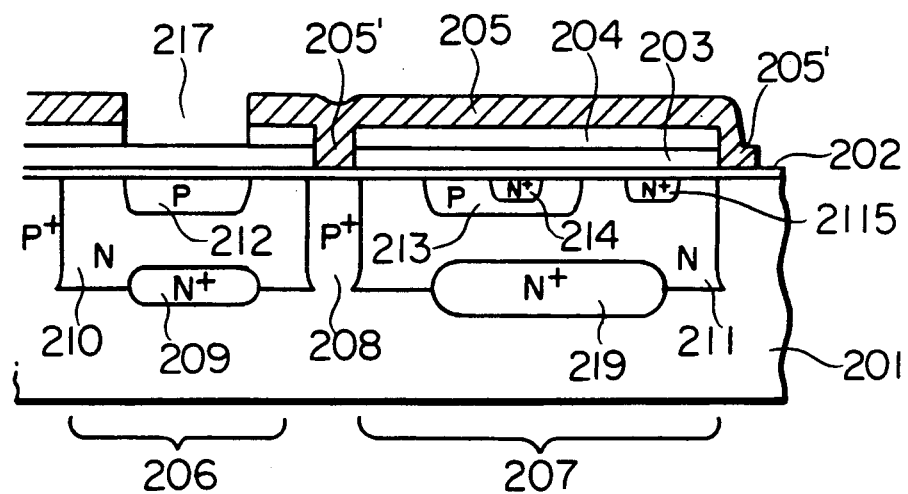

FIG. 8(A) shows a plan view of a photo-sensor in accordance with the present invention, and FIG. 8(B) shows a sectional view taken along a line I—I.

In FIGS. 8(A) and 8(B), a photo-diode 206 and a circuit portion 207 are electrically isolated by a P+ device isolation region 208.

The photo-diode 206 and the circuit portion 207 are constructed as follows. An N region 210 and a collector region 211 are formed on an N+ buried layer 209, and a P region 212 is formed on the N region 210 to form the photo-diode 206. A base region 213 is formed in the collector region 211. An emitter region 214 is formed in the base region 213 and an N+ layer 215 to make an ohmic contact with a collector electrode is formed.

Insulation layers 202, 203 and 204 and wiring 216 are formed on the photo-diode 206 and the circuit portion 207, and the insulation layers 203 and 204 are removed to surround the circuit portion 207. Then, light shielding layers 205 and 205' made of conductive material such as Al are formed except on a photo-sensing area 217 of the photo-diode 206. The light shielding layer 205' is a portion of the light shielding layer formed in steps which are ends of the insulation layers 203 and 204. Since the light shielding layer 205' covers the ends of the insulation layers, the light is prevented from entering into the circuit portion even if the light obliquely impinges and the circuit characteristic is stabilized.

Since a portion of the light shielding layer 205' at the steps is formed over the device isolation region 208, the device isolation region may be connected with the light shielding layer 205' by removing the insulation layer 202 to keep the light shielding layer 205 at a constant potential. Thus, a change of parasitic capacitance between the light shielding layer 205 and the substrate 201 is suppressed and the stability of the circuit portion 207 is further enhanced. Accordingly, a small signal produced by the photo-diode 206 can be amplified or converted by a stable operation without being effected by external light.

In the semiconductor device of the present invention, since the ends of the insulation layers are covered by the light shielding layer, stable operation without effect by external light is attained.

No special step to cover the ends of the insulation layers by the light shielding layer is necessary but they are covered in the step of forming the light shielding layer.

We claim:

1. A semiconductor device comprising:
   a substrate;
   a circuit portion formed on said substrate;
   an insulating layer formed at least on said circuit portion;
   a light shielding layer formed at least on a portion of said insulating layer on said circuit portion; and
   light scattering means provided in said insulating layer under a periphery of said light shielding layer, wherein said light scattering means substantially surrounds a periphery of said circuit portion for attenuating obliquely impinging light, and wherein said light scattering means has a side surface for reflecting incident light.

2. A semiconductor device comprising:
   a substrate;
   a circuit portion formed on said substrate;
   an insulating layer formed at least on said circuit portion;
   a light shielding layer formed at least on a portion of said insulating layer on said circuit portion; and
   light scattering means provided to cover an edge portion of said insulating layer under a periphery of said light shielding layer, wherein said light scattering means substantially surrounds a periphery of said circuit portion.

3. A semiconductor device comprising:
   a substrate having a photosensor section and a circuit portion for receiving a signal outputted from said photosensor section;
   an insulating layer provided on said substrate;
   a light shielding layer provided on said insulating layer; and
   light scattering means provided between said substrate and said light shielding layer,
   wherein said light shielding layer is provided on said circuit portion, and wherein said light scattering means substantially surrounds a periphery of said circuit portion so as to prevent incident light from impinging on an edge portion of said insulating layer.

4. A semiconductor device according to claim 1, wherein said light scattering means comprises a discontinuous portion.

5. A semiconductor device according to claim 1, wherein said circuit portion comprise plural semiconductor elements, and wherein said periphery of said circuit portion is disposed outside a portion of said semiconductor elements.

6. A semiconductor device according to claim 1, wherein said circuit portion comprises a bipolar transistor.

7. A semiconductor device according to claim 1, wherein said circuit portion comprises an MOS transistor.

8. A semiconductor device according to claim 1, wherein said circuit portion comprises a bipolar transistor and an MOS transistor.

9. A semiconductor device according to claim 2, wherein said light scattering means covers an edge of said insulating layer.

10. A semiconductor device according to claim 2 further comprising an element isolation region disposed on said substrate, wherein said light scattering means is provided on said element isolation region.

11. A semiconductor device according to claim 2, further comprising an element isolation region disposed on said substrate, wherein said light scattering means is provided on said element isolation region and is electrically connected to said element isolation region.

12. A semiconductor device according to claim 2, wherein said light scattering means comprises a discontinuous portion.

13. A semiconductor device according to claim 2, wherein said circuit portion comprises plural semiconductor elements, and wherein said periphery of said circuit portion is disposed outside a portion of said semiconductor elements.

14. A semiconductor device according to claim 2, wherein said circuit portion comprises a bipolar transistor.

15. A semiconductor device according to claim 2, wherein said circuit portion comprises an MOS transistor.

16. A semiconductor device according to claim 2, wherein said circuit portion comprises a bipolar transistor and an MOS transistor.

17. A semiconductor device according to claim 3, wherein said light scattering means covers the edge portion of said insulating layer.

18. A semiconductor device according to claim 3, further comprising an element isolation region disposed on said substrate, wherein said light scattering means is provided on said element isolation region.

19. A semiconductor device according to claim 3, further comprising an element isolation region disposed on said substrate, wherein said light scattering means is provided on said element isolation region and is electrically connected to said element isolation region.

20. A semiconductor device according to claim 3, wherein said light scattering means comprises a discontinuous portion.

21. A semiconductor device according to claim 3, wherein said circuit portion comprises plural semiconductor elements, and wherein said periphery of said circuit portion is disposed outside a portion of said semiconductor elements.

22. A semiconductor device according to claim 3, wherein said circuit portion comprises a bipolar transistor.

23. A semiconductor device according to claim 3, wherein said circuit portion comprises an MOS transistor.

24. A semiconductor device according to claim 3, wherein said circuit portion comprises a bipolar transistor and an MOS transistor.

25. A semiconductor device according to claim 1 wherein said light shielding layer is conductive and maintained at a constant potential.

26. A semiconductor device according to claim 25 wherein said light shielding layer is connected to said substrate.

27. A semiconductor device according to claim 2 wherein said light scattering means comprises at least one scattering line.

28. A semiconductor device according to claim 27, wherein a pitch between plural scattering lines is random.

29. A semiconductor device according to claim 28, wherein said circuit portion is provided with wiring and wherein said scattering line is made of the same material as that of said wiring.

30. A semiconductor device according to claim 27, wherein said circuit portion comprises a gate electrode and wherein said scattering line is made of the same material as that of said gate electrode.

* * * * *

UNITED STATES PATENT AND TRADEMARK OFFICE
CERTIFICATE OF CORRECTION

PATENT NO. : 5,061,978

DATED : October 29, 1991

INVENTOR(S) : HIDEMASA MIZUTANI ET AL.

Page 1 of 2

It is certified that error appears in the above-identified patent and that said Letters Patent is hereby corrected as shown below:

COLUMN 1

Line 33, "ÅA" should read --Å--.
    Line 36, "polysilcon" should read --polysilicon--.

COLUMN 2

Line 5, "by" should be deleted.
    Line 31, "1984)" should read --1984,-- and
           "1986," should read --1986),--.
    Line 41, "thereof" should read --thereof,--.

COLUMN 3

Line 7, "poriton" should read --portion--.
    Line 8, "electrode" should read --electrodes--.
    Line 35, "layer 110 is" should read --layers 110 are--.

UNITED STATES PATENT AND TRADEMARK OFFICE
CERTIFICATE OF CORRECTION

PATENT NO. : 5,061,978
DATED : October 29, 1991
INVENTOR(S) : HIDEMASA MIZUTANI ET AL It is certified that error appears in the above-indentified patent and that said Letters Patent is hereby corrected as shown below:

COLUMN 4

Line 17, "are" should read --is--.

Signed and Sealed this

Eighth Day of June, 1993

Attest:

MICHAEL K. KIRK

Attesting Officer

Acting Commissioner of Patents and Trademarks